(12) United States Patent
Kalweit et al.

(10) Patent No.: US 12,360,426 B2
(45) Date of Patent: Jul. 15, 2025

(54) METHODS FOR PRODUCING LOWER ELECTRICAL ISOLATION IN ELECTROCHROMIC FILMS

(71) Applicant: SAGE ELECTROCHROMICS, INC., Faribault, MN (US)

(72) Inventors: Harvey Kalweit, Burnsville, MN (US); Satya Ajjarapu, Cupertino, CA (US); Li-Ya Yeh, Geilenkirchen (DE); Jean-Christophe Giron, Edina, MN (US)

(73) Assignee: SAGE ELECTROCHROMICS, INC., Faribault, MN (US)

( * ) Notice: Subject to any disclaimer, the term of this patent is extended or adjusted under 35 U.S.C. 154(b) by 0 days.

(21) Appl. No.: 17/453,971

(22) Filed: Nov. 8, 2021

(65) Prior Publication Data
US 2022/0057686 A1    Feb. 24, 2022

Related U.S. Application Data

(62) Division of application No. 15/439,612, filed on Feb. 22, 2017, now Pat. No. 11,194,211, which is a
(Continued)

(51) Int. Cl.
*G02F 1/153*       (2006.01)
*B23K 26/06*       (2014.01)
(Continued)

(52) U.S. Cl.
CPC ........ *G02F 1/1533* (2013.01); *B23K 26/0626* (2013.01); *B23K 26/364* (2015.10);
(Continued)

(58) Field of Classification Search
CPC ........ G02F 1/1533; G02F 1/155; G02F 1/153; G02F 2001/1555; G02F 2201/503;
(Continued)

(56) References Cited

U.S. PATENT DOCUMENTS 5,321,544 A    6/1994    Parkhe et al.
5,370,775 A    12/1994   Parkhe
(Continued)

FOREIGN PATENT DOCUMENTS

CN    102388340 A    3/2012
EP    2538453 A1     12/2012
(Continued)

OTHER PUBLICATIONS

Supplementary European Search Report for EP14868114.1, mailed Jun. 19, 2017, 1 page.
(Continued)

*Primary Examiner* — Tuyen Tra
*Assistant Examiner* — Rahman Abdur
(74) *Attorney, Agent, or Firm* — Abel Schillinger, LLP; Robert N Young (57) ABSTRACT

The present invention provides for an electroactive device having a first conductive layer, a second conductive layer, and one or more electroactive layers sandwiched between the first and second conductive layers. One or more adjacent layers of the electroactive device may include a physical separation between a first portion and a second portion of the adjacent layers, the physical separation defining a respective tapered sidewall of each of the first and second portions. The one or more adjacent layers may include one of the first and second conductive layers. The remaining layers of the electroactive device may be formed over the physical separation of the one or more adjacent layers. The remaining layers may include the other of the first and second conductive layers.

20 Claims, 9 Drawing Sheets

Related U.S. Application Data division of application No. 14/095,308, filed on Dec. 3, 2013, now abandoned.

(51) Int. Cl.

| | |
|---|---|
| *B23K 26/364* | (2014.01) |
| *C23C 14/08* | (2006.01) |
| *C23C 14/34* | (2006.01) |
| *G02F 1/155* | (2006.01) |

(52) U.S. Cl.
CPC ............ *C23C 14/086* (2013.01); *C23C 14/34* (2013.01); *G02F 1/153* (2013.01); *G02F 1/155* (2013.01); *G02F 2001/1555* (2013.01); *G02F 2201/503* (2013.01); *Y10T 29/49156* (2015.01)

(58) Field of Classification Search
CPC .......................... B23K 26/364; B23K 26/0626; C23C 14/086; C23C 14/34; Y10T 29/49156
USPC ......................................................... 359/265
See application file for complete search history.

(56) References Cited

U.S. PATENT DOCUMENTS

| | | | |
|---|---|---|---|
| 5,404,244 | A | 4/1995 | Van Dine et al. |
| 5,659,417 | A | 8/1997 | Van Dine et al. |
| 5,699,192 | A | 12/1997 | Van Dine et al. |
| 5,724,175 | A | 3/1998 | Hichwa et al. |
| 5,724,177 | A | 3/1998 | Ellis, Jr. et al. |
| 6,515,787 | B1 | 2/2003 | Westfall et al. |
| 7,193,763 | B2 | 3/2007 | Beteille et al. |
| 7,247,573 | B2 | 7/2007 | Spandre |
| 7,372,610 | B2 | 5/2008 | Burdis et al. |
| 7,593,154 | B2 | 9/2009 | Burdis et al. |
| 7,749,907 | B2 | 7/2010 | Miyairi et al. |
| 8,004,744 | B2 | 8/2011 | Burdis et al. |
| 8,043,796 | B2 | 10/2011 | Akimoto |
| 8,043,969 | B2 | 10/2011 | Miyairi et al. |
| 8,134,067 | B1 | 3/2012 | Tsai |
| 8,148,259 | B2 | 4/2012 | Arai et al. |
| 8,391,331 | B2 | 3/2013 | Eichberger et al. |
| 9,013,778 | B2 | 4/2015 | Burdis et al. |
| 9,152,001 | B2 | 10/2015 | Burdis et al. |
| 2002/0154379 | A1 | 10/2002 | Tonar et al. |
| 2004/0178417 | A1* | 9/2004 | Andrews ................. H01L 33/20 257/93 |
| 2004/0202886 | A1* | 10/2004 | Subramanian ........... G01N 3/56 427/596 |
| 2005/0195488 | A1 | 9/2005 | McCabe |
| 2006/0203323 | A1 | 9/2006 | Tonar et al. |
| 2007/0274353 | A1 | 11/2007 | Hauck et al. |
| 2008/0297879 | A1 | 12/2008 | Tonar et al. |
| 2009/0304912 | A1 | 12/2009 | Kawak et al. |
| 2011/0135837 | A1 | 6/2011 | Burdis et al. |
| 2012/0019889 | A1 | 1/2012 | Lamine et al. |
| 2012/0062976 | A1 | 3/2012 | Burdis |
| 2012/0318776 | A1* | 12/2012 | Rekow ................... B23K 26/40 219/121.68 |
| 2013/0017441 | A1 | 1/2013 | Affinito et al. |
| 2013/0107345 | A1 | 5/2013 | Kailasam et al. |
| 2013/0267076 | A1* | 10/2013 | Lei .......................... B23K 26/40 438/460 |
| 2013/0278988 | A1 | 10/2013 | Jack et al. |
| 2014/0253996 | A1* | 9/2014 | Burdis .................... G02F 1/155 359/265 |
| 2015/0153622 | A1 | 6/2015 | Kalweit et al. |
| 2017/0160619 | A1 | 6/2017 | Kalweit et al. |

FOREIGN PATENT DOCUMENTS

| | | | | |
|---|---|---|---|---|
| JP | 2002076390 | A | 3/2002 | |
| JP | 2004198966 | A | 7/2004 | |
| JP | 2011009307 | A | 1/2011 | |
| JP | 2012517089 | A | 7/2012 | |
| JP | 2012523018 | A | 9/2012 | |
| JP | 2012243864 | A | 12/2012 | |
| JP | 2013536996 | A | 9/2013 | |
| TW | 201342509 | A | 10/2013 | |
| WO | 2004068231 | A1 | 8/2004 | |
| WO | 2010089681 | A1 | 8/2010 | |
| WO | 2012007334 | A1 | 1/2012 | |
| WO | WO-2013090209 | A1 * | 6/2013 | ......... B23K 26/0624 |
| WO | 2013163107 | A1 | 10/2013 | |

OTHER PUBLICATIONS

International Search Report and Written Opinion for PCT Application No. PCT/US2014/068357, mailed Feb. 26, 2015, 16 pages.
International Search Report & Written Opinion for Application No. PCT/US2014/011657 dated Apr. 25, 2014.
International Search Report & Written Opinion for Application No. PCT/US2014/047955 dated Oct. 13, 2014.

* cited by examiner

METHODS FOR PRODUCING LOWER ELECTRICAL ISOLATION IN ELECTROCHROMIC FILMS

CROSS-REFERENCE TO RELATED APPLICATION

This application is a divisional of and claims priority under 35 U.S.C. § 120 to U.S. patent application Ser. No. 15/439,612, entitled "Methods for Producing Lower Electrical Isolation in Electrochromic Films," by Harvey KALWEIT et al., filed Feb. 22, 2017, which application is a divisional of and claims priority under 35 U.S.C. § 120 to U.S. patent application Ser. No. 14/095,308, entitled "Methods for Producing Lower Electrical Isolation in Electrochromic Films," by Harvey KALWEIT et al., filed Dec. 3, 2013, all of which are assigned to the current assignee hereof and incorporated herein by reference in their entireties.

BACKGROUND OF THE INVENTION

The present invention relates to improvements in electroactive devices and more particularly relates to improvements in solid-state, inorganic thin film devices.

One example of an electroactive device that the present invention relates to is an electrochromic device ("EC device"). Electrochromic materials and devices have been developed as an alternative to passive coating materials for light and heat management in building and vehicle windows. In contrast to passive coating materials, electroactive devices employ materials capable of reversibly altering their optical properties following electrochemical oxidation and reduction in response to an applied potential. The optical modulation is the result of the simultaneous insertion and extraction of electrons and charge compensating ions in the electrochemical material lattice.

Figure 1:
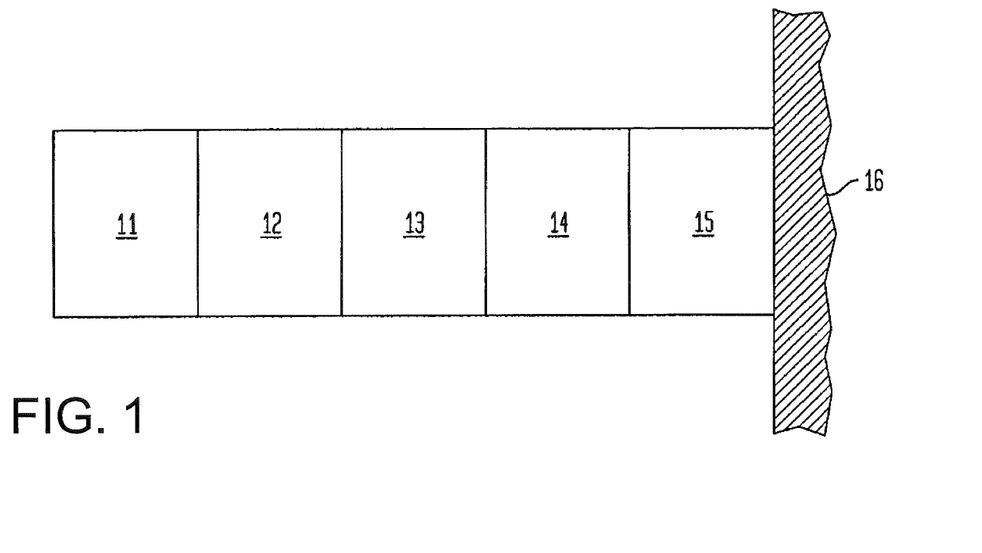
FIG. 1 is a schematic cross-section of a typical electrochromic device.

EC devices have a composite structure through which the transmittance of light can be modulated. FIG. 1 illustrates a typical five layer solid-state electrochromic device in cross-section having the five following superimposed layers: an electrochromic electrode layer ("EC") 14 which produces a change in absorption or reflection upon oxidation or reduction; an ion conductor layer ("IC") 13 which functionally replaces an electrolyte, allowing the passage of ions while blocking electronic current; a counter electrode layer ("CE") 12 which serves as a storage layer for ions when the device is in the bleached or clear state; and two transparent conductive layers ("TCLs") 11 and 15 which serve to apply an electrical potential to the electrochromic device. Each of the aforementioned layers is typically applied sequentially on a substrate 16. Such devices typically suffer from intrinsic and defect-induced electronic leakage (between the electrochromic stack layers) and electronic breakdown.

Figure 2:
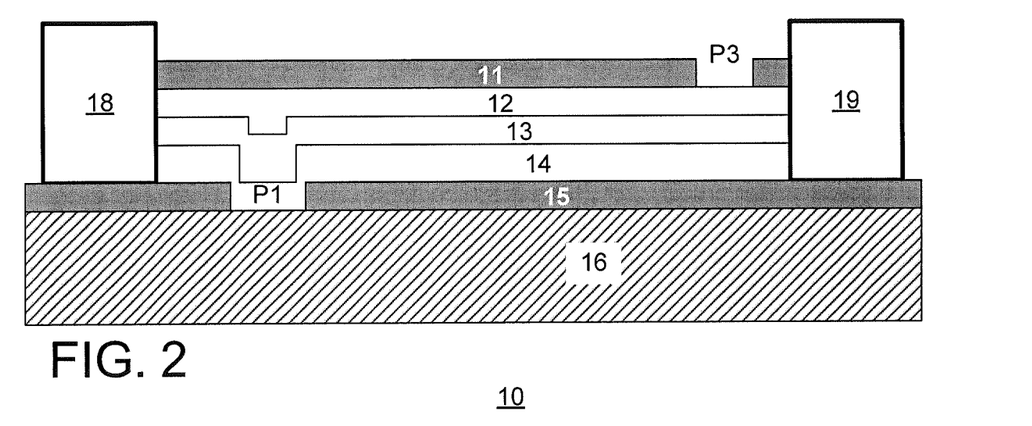
FIG. 2 is another schematic cross-section of a typical electrochromic device.

Typically, electrical power is distributed to the electrochromic device through busbars. FIG. 2 illustrates the electrochromic device of FIG. 1, in cross-section, having power supplied from two conductive elements, such as busbars 18 and 19. In order to prevent the busbars from shorting together, the busbars are electrically isolated from one another. Conventionally, this is done by scribing the TCLs 11 and 15. As shown in FIG. 2, the first (lower) TCL 15 is scribed at point P1, making the lower TCL 15 a discontinuous (i.e., physically separate) layer, and thereby preventing the busbars from shorting across the lower TCL 15. The width of the scribe at point P1 is typically on the order of 25 microns or wider, while the length varies based on the width the particular device being formed. Similarly, the second (upper) TCL 11 is scribed at point P3, making the upper TCL 11 also discontinuous, and thereby preventing the busbars from being shorted together across the upper TCL 11. Similar to the dimensions of the P1 scribe, the P3 scribe is typically on the order of 25 microns or wider, while the length varies based on the width the particular device being formed.

In order for a solid state electrochromic device to function correctly, it is necessary to block electric current from passing between the busbars of the electrochromic device directly, other than through the desired electrochromic mechanism. Any electronic current that leaks or passes through the electroactive layers serves to short out the required voltage and inhibits the flow of ions through the electrochromic device. As such, leakage current due to intrinsic or defect-induced electronic leakage leads to compromises in device performance including a lowered dynamic range, non-uniform coloration, decreased ionic conductance, slower switching rates, and increased power consumption.

Merely increasing the thickness of the ion conductor layer may result in a reduction of leakage current, but at the expense of degraded optical properties, increased layer deposition time and cost, and reduced switching rates. Likewise, adding dielectric layers to the stack may reduce leakage current but at the cost of similar defects and possible yield reduction. In general, the yield can be considered to be reduced every time a substrate or other workpiece is cycled between the deposition chamber and atmosphere, and vice versa. This is because dust and debris from the coating process—which are inevitably present in film deposition—are 'blown' around during purging, venting, and/or pump-down, and can find its way onto the active layers, leading to defects in the film structure. Ideally, all the layers could be deposited in one single continuous process step, i.e., one coating machine. However, depositing additional dielectric layers could require transporting the workpiece between coaters to deposit the additional layers and then transporting the workpiece back to resume fabrication of the above described EC stack. Such transportation, which could involve the workpiece exiting and reentering the deposition system and/or additional handling of the workpiece, would significantly increase production time, increase the device's exposure to particles and other contaminants, and greatly increase the risk of damage (e.g., scratching, mishandling, etc.) of the device. Accordingly, it is desirable to reduce the amount of electronic leakage through an electrochromic device without resorting to a thick ion conductor layer or additional dielectric layers so as to avoid these compromises in performance.

The above described challenges are not exclusive to electrochromic devices. Any electroactive device having one or more functional electroactive layers sandwiched between top and bottom conductive layers may present similar challenges if a conductive layer is scribed to prevent shorting across that conductive layer. For instance, scribing the lower conductor layer, and optionally one or more of the electroactive layers, of an electroactive device (e.g., an electroluminescent device having a Conductor/Insulator/Phosphor/Insulator/Conductor structure, an organic light emitting diode (OLED) having a Conductor/Electron Transport Layer/Emitting Layer/Hole Transport Layer/Conductor structure, or photovoltaic device having a Conductor/Electron Donor/P-N Junction/Electron Acceptor/Conductor structure, etc.) would create the risk or possibility of asperities, cracks, delamination, melt spots, and/or other defects along the scribe edge (e.g., within 5 microns of the upper edge of a P1 scribe). Stated another way, the above described challenges are a product of the melting and delamination characteristics of the scribed conductive and electroactive layers, regardless of what electroactive device those layers are incorporated into.

Thus, it is desirable to reduce the amount of electronic leakage between the portions of the transparent conductive layers of the electrochromic device while maintaining as high a yield as possible (e.g., conducting as few scribing steps during the cutting process as possible). More generally, it is desirable to reduce the amount of electronic leakage between upper and lower (i.e., opposing) conductive layers in any electroactive device in which scribing performed during production of the device may lead to electronic leakage from delamination or melting of the scribed layers, and to still maintain as high a yield as possible during production.

BRIEF SUMMARY OF THE INVENTION

One aspect of the disclosure provides an electroactive device including a first conductive layer, a second conductive layer, and one or more electroactive layers sandwiched between the first and second conductive layers. For example, the device may include a first electrode that is one of an electrochromic electrode layer and a counter electrode layer, and a second electrode that is the other of the electrochromic electrode layer and the counter electrode layer. The electroactive (e.g., an electrochromic device, an electroluminescent device, a battery, a photochromic device, a thermochromic device, a suspended particle device, a liquid crystal display device, a photovoltaic device, a light emitting diode etc.) device may further include an ion-conductor layer for conducting ions between the first and second electrodes, and first and second conductive layers, the first and second electrodes and the ion-conductor layer being sandwiched between the first and second conductive layers.

One or more adjacent layers of the device may include a physical separation between a first portion and a second portion of that conductive layer. The physical separation may define respectively tapered sidewalls of each of the first and second portions. The remaining layers of the electroactive device may be formed on the one or more adjacent layers over the physical separation. In some examples of the disclosure, the one or more adjacent layers may include one of the first and second conductive layers, and the remaining layers of the electroactive device may include the other of the first and second conductive layers. In some examples, the one or more adjacent layers may include at least one of the electroactive layers. In some examples, the reaming layers may include all of the electroactive layers, such that each electroactive layer is formed above the physical separation.

In some examples of an electrochromic device in accordance with the disclosure, the one or more adjacent layers may further include one of the first and second electrode layers, and the remaining layers of the electroactive device may include the other of the first and second electrode layers and the ion conductor layer. In some further examples, the one or more adjacent layers may further include one of the first and second electrode layers and the ion conductor layer, and the remaining layers of the electroactive device may include the other of the first and second electrode layers. In yet further examples, the remaining layers of the electroactive device may include the ion conductor layer and both of the first and second electrode layers.

In some examples, the one or more adjacent layers may be at least about twice as thick as the remaining layers of the electroactive (e.g., electrochromic, etc.) device that are between the scribed adjacent layers and the other of the first and second conductive layer (i.e., the conductive layer not scribed at P1, as defined below). In further examples, the one or more adjacent layers may be at least about three times as thick as the remaining layers of the electroactive (e.g., electrochromic, etc.) device that are between the scribed adjacent layers and the other of the first and second conductive layer (i.e., the conductive layer not scribed at P1, as defined below).

In some examples, one of the first and second electrodes may be formed directly above the conductive layer having the physical separation. The physical separation between the first and second portions may be filled at least partially by the above electrode.

In some examples, the conductive layer having the physical separation does not have melt spots along the tapered sidewalls. In some further examples, the electroactive (e.g., electrochromic, etc.) device may include a substrate, and the conductive layer having the physical separation may directly touch the substrate without having delamination along the respective tapered sidewalls.

In some examples, each of the tapered sidewalls may have a substantially linear profile. In other examples, each of the tapered sidewalls may have a substantially Gaussian profile. In further examples, the incline of each of the tapered sidewalls (i.e., with respect or relative to the substrate) may be about 45 degrees or less relative to the plane of the substrate such that each sidewall does not exhibit shadowing. In some further examples, the electroactive device may further include a physical separation between the second portion and a third portion of the plurality of electroactive layers. That physical separation may define a respective tapered sidewall of each of the second and third portions Another aspect of the disclosure provides a method of fabricating an electroactive (e.g., electrochromic, etc.) device. The method may include providing a substrate and forming one or more adjacent layers of the electroactive (e.g., electrochromic, etc.) device on the surface of the substrate. The method may further include positioning a laser or other scribing implement towards the substrate. In some examples, the laser or other scribing implement may be positioned incident the side of the substrate having the one or more adjacent layers formed thereon (i.e., the film side). In some examples, the laser may have a pulse width of about 100 picoseconds or shorter. The method may further include removing a portion of the one or more adjacent layers, and forming one or more of the remaining layers of the device over the physical separation of the one or more adjacent layers.

In some examples, removing a portion of the one or more adjacent layers from the substrate using the laser or other scribing implement may further involve forming a physical separation between a first portion and a second portion of the one or more adjacent layers, the physical separation defining a respective tapered sidewall of each of the first and second portions.

In some examples, the pulse width of the laser may be even shorter than 100 picoseconds. For example, the pulse width may be about 10 picoseconds or shorter. For further example, the pulse width of the laser may be about 6 picoseconds.

In some examples the wavelength of the laser may be between about 340 nm and about 1070 nm. In further examples, the wavelength may be between about 515 nm and about 532 nm.

Yet a further aspect of the disclosure provides a system for fabricating an electroactive (e.g., electrochromic, etc.) device. The system may include a housing for containing a substrate on which the device is formed, a deposition system for depositing one or more layers of the electrochromic device onto the substrate, a laser or other scribing implement mounted in the housing, a positioning device for moving the laser beam or other scribing implement relative to the substrate, and a collection system for collecting particulate materials or vapors generated by focusing of the beam on the surface of the substrate. In some examples, the laser or other scribing implement may be mounted and positioned incident to the film side of the substrate. In some examples, the mounted and positioned laser may have a pulse width of 100 picoseconds or shorter.

In some examples of the disclosure, one or more adjacent layers of the electrochromic device may be formed on the substrate, a portion of those layers may be removed, and one or more of the remaining layers of the device may be formed over the one or more adjacent layers, all without removing the substrate from the housing. In further examples, every layer of the electroactive (e.g., electrochromic, etc.) device which is formed during the first stage of fabrication may be formed without removing the substrate from the housing. In some further examples, each of the above described steps, including the scribing step, may be performed in a single continuous vacuum step within the housing.

DETAILED DESCRIPTION

The present disclosure provides an electroactive layer structure having a reduced amount of electronic leakage between the upper and lower conductive layers. This structure is to be obtainable by a production method that maintains as high a yield as possible. These objectives are implemented by providing a properly adjusted laser having a pulse width on the order of about 100 picoseconds or shorter. In some embodiments, the pulse width may be about 50 picoseconds or shorter. In other embodiments, the pulse width may be about 10 picoseconds or shorter. In yet other embodiments, the pulse width may be about 6 picoseconds. It has been surprisingly and unexpectedly found that scribing the lower layer or layers of the electroactive structure using a laser with a pulse width on the order of about 100 picoseconds or shorter optimizes the amount of spreading of heating across the layer structure during the scribing process. A pulse width of about 100 picoseconds or shorter has been found to be long enough to remove or ablate a portion of the lower layers (e.g., in the context of an electrochromic device, the lower conductive layer, the electrochromic layer, and the ion conducting layer) from the substrate, yet short enough to avoid delamination of the lower layers from the substrate along the scribe edges due to excessive diffusion of the heat generated during the scribing. By avoiding delamination along the scribe edges, the structure is less prone to cracking, which in turn leaves the lower conductive layer of the structure less prone to exposure to the upper conductive layer as a result of such cracking. Since electronic leakage between the upper and lower conductive layers is often caused by coupling between the upper conductive layer and an exposed portion of the lower conductive layer, avoiding exposure of lower conductive layer also in turn reduces the amount of or possibility of electronic leakage between the two conductive layers.

Furthermore, a pulse width on the order of about 100 picoseconds or shorter has been found to avoid creating melt spots, which are unlevel ridges or caves of heated material that is not removed from the electroactive structure during the scribing processes. These melt spots form along the scribe edges (e.g., at least a portion of the melt spot being located within 5 microns or less of the upper edge of the scribe edge) due to excessive diffusion of heat generated during the scribing. By using a laser with a shorter pulse width, less unwanted heat is spread across the structure, thus avoiding the creation of melt spots along the scribe edges. As a result, the scribed lower layer(s) retain a relatively smooth profile (compared to a layer having melt spots). This in turn permits other layers to be deposited on top of those lower layers also with relatively smooth profiles, permitting better coverage of the lower conductive layer, and thereby minimizing the possibility of a pinhole contact or electrical short between the upper and lower conductive layers along the scribed edges.

The objectives of the present disclosure are further implemented by positioning the laser incident to the film or stack side (hereinafter referred to as the "film" side for brevity) of the substrate on which the electroactive structure is formed, as opposed to incident to the substrate side (i.e., the side of the substrate opposite the electroactive structure). A laser beam emitted from a laser positioned opposite the film side of the substrate must penetrate through the substrate and any other intervening layers in order to scribe the material formed on the film side. In such situations, the beam is prone to be blocked, scattered, or defocused by bubbles or solid inclusions, which are common in ordinary quality float glass, such as what is typically used in windows for buildings. Blockage of the beam can result in a portion of the material not being scribed, which in the case of the lower conductive layer, may lead to a conductive bridge (i.e., a short) between the isolated portions of the layer. By contrast, a laser beam emitted from a laser positioned incident to the film side of the substrate is not prone to such blockages, and therefore is less prone to leaving behind a conductive bridge in the lower conductive layer.

Furthermore, positioning a laser having a varying energy profile incident to the film side of the substrate has been found to enable good step coverage of the film layers between the upper and lower conductive layers. A laser beam emitted opposite the film side of the substrate has been found to form scribe sidewalls having a steep cliff-like profile along the scribe edges, leaving the lower conductive layer prone to exposure due to poor step coverage by the additional film layers. Exposure of the lower conductive layer in turn can result in shorts between the upper and lower conductive layers. By contrast, a laser beam emitted incident to the film side has surprisingly been found to form scribe sidewalls having a tapered profile. The tapered scribe edges enable better step coverage so that no portion of the lower conductive layer is left exposed, which in turn means a lower likelihood of shorts between the upper and lower conductive layers.

Thus, using a laser having a pulse width of about 100 picoseconds or shorter, and/or positioning the laser incident to the film side of the substrate, results in a significant reduction of breakages, pinhole contacts, or other causes of exposure between the upper and lower conductive layers. In combination, positioning a laser having a pulse width of about 100 picoseconds or shorter incident to the film side of the substrate can result in even more dramatic reduction of such defects, and has been shown to virtually eliminate shorting between the conductive layers entirely, resulting in better operation (e.g., coloring in an electrochromic device) and improved energy efficiency, compared to a device having a conductive layer scribed by a laser having a 1 ns pulse width and positioned opposite the film side of the substrate.

While above described improvements are broadly applicable to many scribed thin film electroactive stacks (e.g., electrochromic devices, batteries, photochromic devices, thermochromic devices, suspended particle devices, liquid crystal display devices, photovoltaic cells, light emitting diodes, etc.), regardless of the relative thickness of the respective conductive and electroactive layers, the implementations described in present disclosure are especially beneficial when depositing relatively thin layers on top of relatively thick scribed layers. For instance, using the electroactive layers of an electrochromic device as an illustrative example, if a scribed transparent lower conductive layer of the device is thicker than the electrode layers and ion conducting layer of the device, then imperfections (e.g., delamination, asperities, cracks, melt spots, etc.) created during the scribing of the lower transparent conductive layer or layers may not be fully or evenly covered by the other layers formed on top, thereby leaving the lower transparent conductive layer exposed to the upper transparent conductive layer, leading to electronic leakage in the device. While this leakage can be tolerated or compensated up to a certain point in the device, this leakage becomes a much greater problem when the scribed layer or layers are about twice as thick or more than the unscribed layers formed on top, and an even greater problem when the scribed layer or layers are about three times thicker than the unscribed layers formed on top. As such, the improvements of the present disclosure are especially beneficial for, albeit not limited to, electroactive layer structures having one or more scribed layers that are about twice as thick, three times as thick, or more than three times as thick as the unscribed layers (not including the upper conductor layer) formed on top of the scribed layers).

In the case of an electrochromic layer structure, reducing the risk of producing shorts in the electrochromic layer structure further eliminates the need for forming additional dielectric layers above the lower conductive layer. An advantage to omitting these additional dielectric layers from the layer structure is that processing of the structure can be performed with only a single pass of the substrate (or "workpiece") through the initial coater. Generally, in order to form the additional dielectric layers to improve step coverage, the workpiece must be transferred out of the initial coater, where the lower conductive layer is formed and scribed, to a different coater, where the dielectric layers are formed, and then back to the initial coater, where the remaining initial layers (e.g., the electrochromic electrode layer, the ion conducting layer, etc.) are formed Eliminating the additional dielectric layers reduces exposure of the workpiece to the outside environment (which normally occurs during transfer), thereby improving yield and minimizing the risk of defects to the device during processing (e.g., scratches, edge chips, accumulated particles on the surface of the workpiece, other mechanical damage). Even if the additional dielectric layers would be deposited in the same coater, eliminating the additional dielectric layers would reduce the processing time per workpiece.

Figure 3:
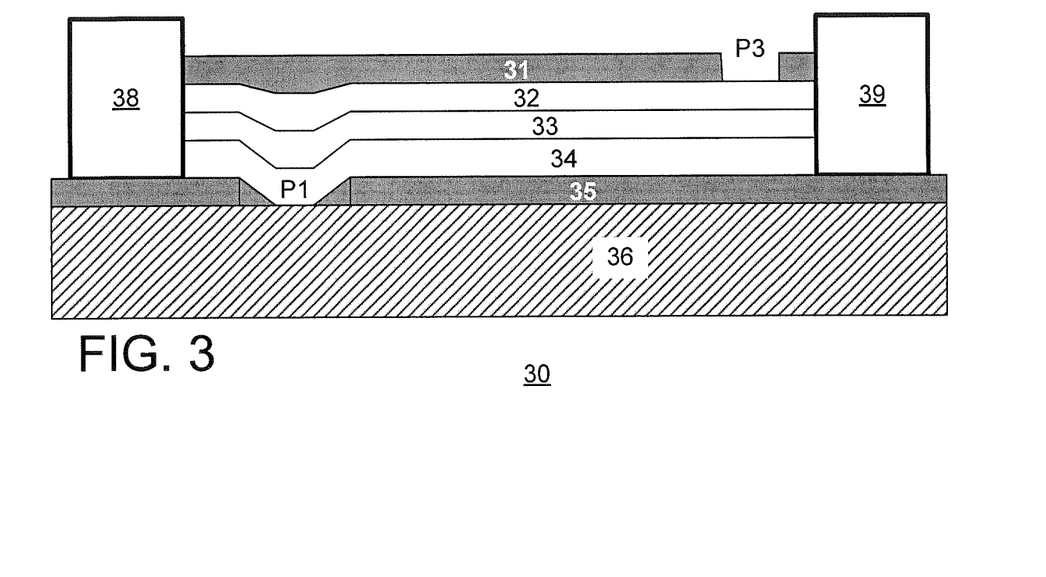
FIG. 3 is a schematic cross-section of an electrochromic device in accordance with an embodiment of the present disclosure.

In accordance with the present invention, FIG. 3 illustrates a portion of a solid-state electroactive device 30, in cross-section, having an improved film structure. For purposes of illustrative clarity, the electroactive device 30 depicted in FIG. 3 is an electrochromic device similar to the device depicted in FIGS. 1 and 2. However, it will be recognized that the present invention is similarly applicable to other types of scribed electroactive devices, as well as other electrochromic devices with different stacks or film structures (e.g., additional layers). With regard to the electrochromic device 30 of FIG. 3, that device is similar to the device of FIGS. 1 and 2 only to the extent that each of the aforementioned layers, 11-15 are present in the device of FIG. 3 (as layers 31-35). The device of FIG. 3 differs from the device depicted in FIGS. 1 and 2 to the extent that the sidewall profile of the scribe at location P1 is shaped differently and has different properties or characteristics. For example, whereas the sidewall profile of the scribe in FIGS. 1 and 2 is substantially vertical or cliff-like, the profile in FIG. 3 is tapered. For further example, although not depicted in the figures, the lower conductive layer of the device of FIGS. 1 and 2 is subject to delamination and melt spots along the scribe edges, whereas the improved device of FIG. 3 does not have delamination defects or melt spots.

In FIG. 3, lower conductive layer 35 is formed on substrate 36 and includes a first portion coupled to a first busbar 38 and a second portion coupled to a second busbar 39. The first portion and second portion are physically separated from one another at location P1 by the scribe. The physical separation is covered and filled, either completely or partially, by the remaining layers of the electrochromic device, which include the electrode layer 34 formed directly thereon (which may be either the electrochromic electrode layer or the counter electrode layer), the ion conductor layer 33, the other electrode layer 32 (which may be the other of the electrochromic electrode layer and the counter electrode layer), and the upper conductive layer 31. Because of the tapered profile of the scribe sidewalls, which is relatively smooth compared to the scribe sidewalls of the device in FIGS. 1 and 2, the electrode layer 34 provides improved step coverage along the scribe edge over the lower conductive layer. Whereas, the ion conducting layer 13 shown in FIG. 2 reaches almost to the sidewall of the lower conductive layer 15, the electrode layer 34 in FIG. 3 maintains improved separation between the ion conducting layer 33 and the lower conductive layer 35. Moreover, the electrode layers 32 and 34, and the ion conductor layer 33 sandwiched in between, collectively provide improved step coverage along the scribe edge over the lower conductive layer 31 so that there are no current leaks or shorts between the respective conductive layers 31 and 35.

In the example of FIG. 3, the scribe sidewalls at location P1 have a linearly tapered profile. However, other profiles (e.g., Gaussian or normal distribution curve-shaped, substantially Gaussian or otherwise curve-shaped, etc.) may be achieved by adjusting the spatial beam energy profile of the laser. In some examples, each tapered sidewall may provide a smooth transition between the surface of the scribed layers and the surface of the substrate. For instance, each tapered sidewall may have a rounded upper edge. For further instance, the overall slope of each tapered sidewall may be about 45 degrees with respect to the plane of the substrate. In some examples, in order to minimize the risk of shadowing, each tapered sidewall could be formed such that no section of the sidewalls would have a slope steeper than 45 degrees with respect to the plane of the substrate.

Figure 4A:
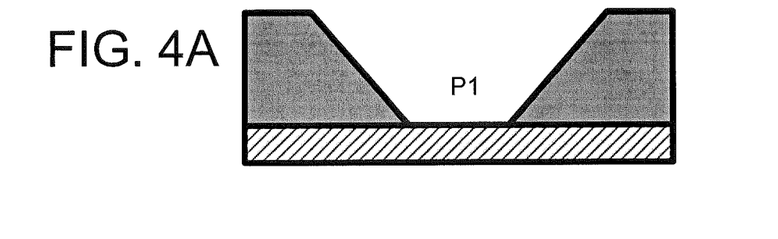
FIGS. 4A-4C are each schematic cross-sections showing a close-up of a portion of an electrochromic device each in accordance with an embodiment of the present disclosure.
Figure 4B:
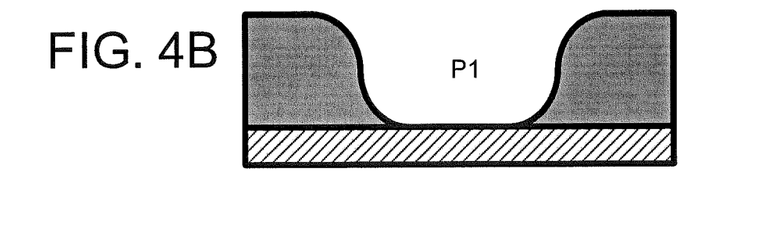
Figure 4C:
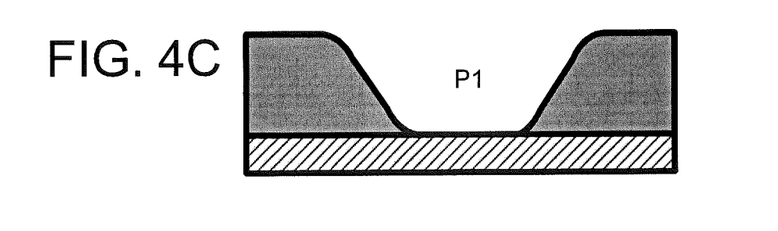

FIGS. 4A-4C depict some possible sidewall profiles that may be achieved. For example, FIG. 4A depicts a close-up of the linear profile of FIG. 3. For further example, FIG. 4B depicts a substantially Gaussian (curved) profile with curved sidewall edges. For yet further example, FIG. 4C depicts a profile having both linear and curved properties. In some examples, the energy profile of the beam may be smoothly varied.

Figure 5:
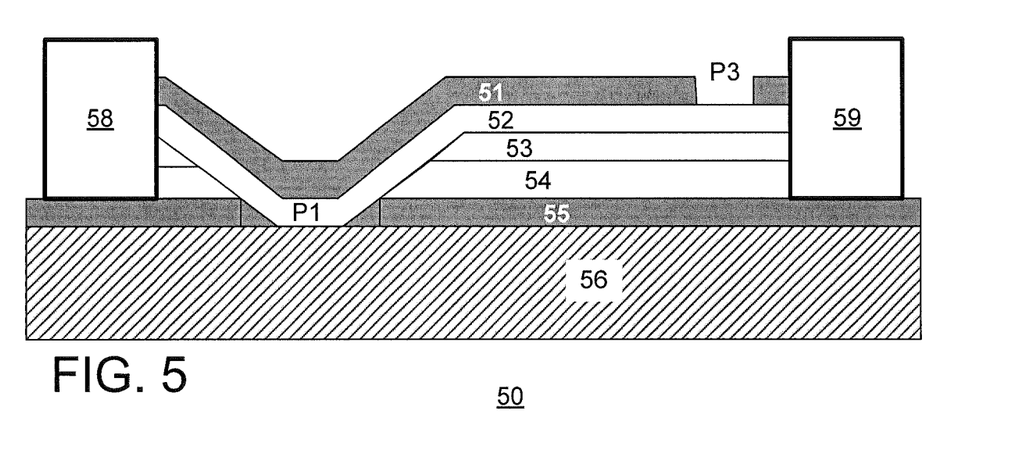
FIG. 5 is another schematic cross-section of an electrochromic device in accordance with an embodiment of the present disclosure.

The present disclosure is similarly applicable to electroactive devices in which multiple layers, and not only the lower conducive layer, are scribed. For example, FIG. 5 illustrates a portion of another solid-state electrochromic device 50, in cross-section, having another improved film structure. The device 50 of FIG. 5 is similar to the solid-state device depicted in FIG. 3 to the extent that each of the aforementioned layers, 31-35 are again present in the device of FIG. 5 (as layers 51-55). The device of FIG. 5 differs from the device depicted in FIG. 3 to the extent that the electrode layer directly adjacent to the lower conductive layer, and the ion conducting layer, have been scribed along with the lower conductive layer. Comparable to FIG. 3, the sidewall profiles of the scribe at location P1 is tapered. Also, like in FIG. 3, each of the scribed layers of the device in FIG. 5 does not have delamination defects or melt spots.

In FIG. 5, each of the lower conductive layer 55, first electrode layer 54, and ion conducting layer 53, is formed on substrate 56 and includes a first portion coupled to a first busbar 58 and a second portion coupled to a second busbar 59. The first portion and second portion of each layer are physically separated from one another at location P1 by the scribe. The physical separation is covered and filled, either completely or partially, by the remaining layers, which include the electrode layer 52 (which may be either the electrochromic electrode layer or the counter electrode layer) and the upper conductive layer 51. Because of the tapered profile of the scribe sidewalls, which is relatively smooth compared to the scribe sidewalls of the device in FIGS. 1 and 2, the electrode layer 52 provides improved step coverage along the scribe edge over the lower conductive layer 55 so that there are no current leaks or shorts between the respective conductive layers 51 and 55.

In the example of FIG. 5, the lower conductive layer, electrochromic electrode layer, and ion conductor layer are more than about twice as thick as the counterelectrode layer. In other examples of the disclosure, the lower conductive layer, electrochromic electrode layer, and ion conductor layer may be more than about three times as thick as the counterelectrode layer. In yet other examples, the lower conductive layer and one or more other scribed adjacent layers may be about twice as thick or more than the layers deposited over the scribed layers and underneath the upper conductive layer. In even further examples, the lower conductive layer and one or more other scribed adjacent layers may be about three time as thick or more than the layers deposited over the scribed layers and underneath the upper conductive layer. In any of the above examples, it may be especially beneficial to scribe the device using a laser having a 100 picosecond pulse width, a laser (or other scribing implement) incident to the film side of the substrate, or both.

Also provided in the present disclosure are methods of fabricating an electroactive device having the above described improvements. The composition or type of layers which are deposited may be varied in order to achieve the desired results without departing from the teachings of the present invention.

Figure 6:
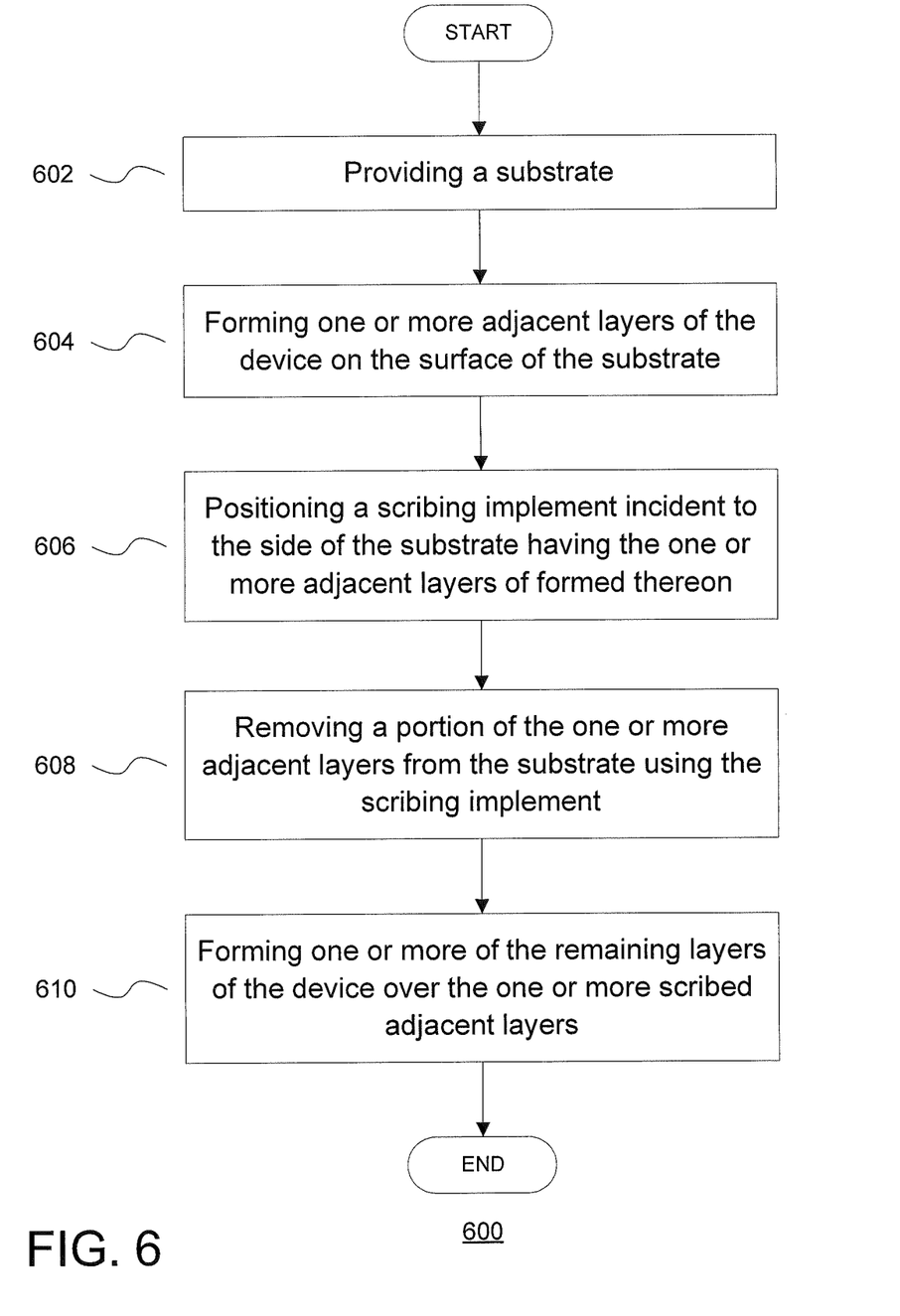
FIG. 6 is a flow chart depicting a process for forming an electrochromic device in accordance with an embodiment of the current invention.

FIG. 6 provides a flow diagram 600 that illustrates a process by which the device 30 may be formed. At block 602, a substrate or workpiece on which the device will be formed or fabricated is provided. The substrate may be an ordinary piece of float glass, as is generally used in building windows, borosilicate glass, or other glass panes such as for automotive or aircraft applications. The substrate may be annealed, heat strengthened, thermally tempered, or chemically strengthened. The substrate may further include other materials suitable for the type of device being fabricated, including many transparent materials such as diamond, aluminum oxide or sapphire, and rigid or flexible polymers. Additionally, opaque materials with surfaces smooth enough to allow specular reflection may be used, when polished or coated to form a reflective background to the electroactive films, resulting in a reflective electroactive device. This could include metals with polished surfaces, and reflective metal or dielectric coatings on semiconductors or dielectrics, such as carbon, silicon, silicon carbide, gallium arsenide, or boron oxide.

At block 604, one or more adjacent layers of the electroactive device, including a layer of conductive material, such as indium tin oxide, are formed on the surface of the substrate. The layers may be deposited such that each layer extends continuously from the first busbar to the second busbar of the device. In some embodiments, the layers may be only the conductive layer. In other embodiments, the layers may further include an electrode layer formed directly above and adjacent to the conductive layer. In yet further embodiments, the layers may include an ion conducting layer formed above the electrode layer. In a preferred embodiment, the materials comprising a conductive layer are deposited via sputtering onto a transparent substrate to form a transparent conductive layer.

At block 606, a scribing implement is positioned incident to the side of the substrate having the one or more adjacent layers formed thereon. The scribing implement may be capable of scribing the layers using one of several different methods, including laser scribing, mechanical abrading involving, for example, use of a diamond, ruby or stainless steel tip, electrical discharge machining, or chemical etching, or another suitable removing processes known in the art ("cutting"). The scribing implement may be mounted in the deposition (e.g., coating) chamber. If the scribing implement is a laser, positioning of the laser may involve focusing a laser beam of the laser at location P1 of the substrate.

At block 608, a portion of the one or more adjacent layers is removed using the scribing implement. In some embodiments, the layers may scribed or cut at location P1. The scribe may extend the entire length of the substrate, i.e., from one end of the substrate to the opposite end, normal to the location P1 shown in the cross-section of FIG. 3. The linewidth of the scribe may be about 25 microns or more. In some embodiments, a scribe having a greater linewidth, or more than one scribe, may be performed around location P1 in accordance with the technology of copending U.S. application Ser. No. 13/950,791, the disclosure of which is hereby incorporated in its entirety herein. For example, multiple identical scribes may be formed in the scribed layers next to (e.g., parallel to) each other. Such scribing would mitigate the risks of discontinuous laser lines, which could possibly lead to leakage (e.g., due to a local defect). In some examples, each scribe may be separated by unscribed material in the scribed layers. In other examples, the multiples scribes could remove all of the material between each scribe, thereby resulting effectively in a single scribe having a relatively large linewidth compared to each individual scribe.

At block 610, one or more of the remaining layers of the electroactive device are formed over the one or more scribed adjacent layers. For example, in the electrochromic device of FIG. 3, the remaining layers may include the electrochromic electrode layer, the counter electrode layer, an ion conducting layer sandwiched between the two electrode layers, and an upper conducting layer formed above the other layers. Deposition of these layers may be performed by sputtering, chemical vapor deposition, or other thin film fabrication methods known in the art, such as those described in copending U.S. application Ser. No. 13/950, 791. In some embodiments, additional layers may be formed in the layer structure, such as anti-reflective coating layers, optical tuning layers, such as those described in U.S. Pat. No. 5,724,177, ion transport layers, such as those described in U.S. Pat. No. 8,004,744, the disclosures of which are hereby incorporated in their entirety herein. Formation of these layers is further described in, for example, U.S. Pat. Nos. 5,699,192, 5,321,544, 5,659,417, 5,370,775, and 5,404,244, the disclosures of which are hereby incorporated by reference in their entirety herein.

In some embodiments, all of the adjacent scribed layers and at least one of the remaining layers are deposited via magnetron sputter deposition in the same vacuum processing chamber so as to increase device fabrication manufacturability, meaning that the substrate undergoes only one stage in coating the initial layers in the fabrication process of the device, that the yields are likely to be improved as a result of reduced handling, and further that the throughput is also likely to be increased as a result of fewer processing steps. Moreover, depositing all of the initial layers in the same chamber without removing the substrate results in a reduction in the number of shorts.

Figure 7:
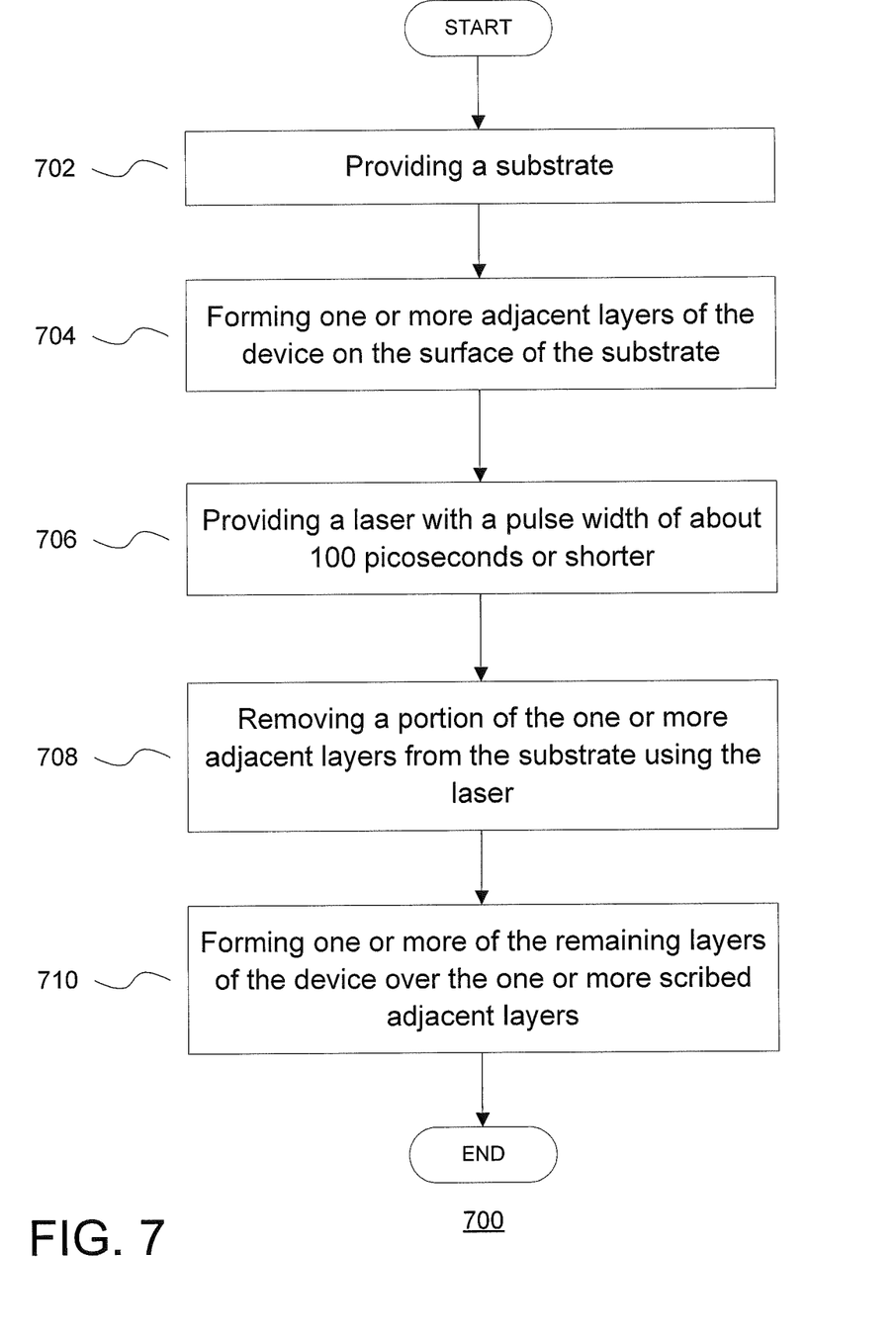
FIG. 7 is another flow chart depicting a process for forming an electrochromic device in accordance with an embodiment of the current invention.

FIG. 7 provides another flow diagram 700 that illustrates another process by which the device 30 may be formed. The steps described in blocks 702, 704, 708, and 710 are respectively comparable to steps 602, 604, 608, and 610 described in connection with flow diagram 600 and are therefore not repeated here. Flow diagram 700 includes an additional step, block 706, which may be performed in lieu or in addition to step 606 of flow diagram 600. At block 706, a laser with a pulse width of about 100 picoseconds or shorter is provided. In the flow diagram 700 of FIG. 7, the laser may be positioned either incident or opposite the film side of the substrate. By positioning a laser having a pulse width of 100 picoseconds or shorter incident to the film side of the substrate, both flow diagrams 600 and 700 may be performed together.

Generally, the pulse width of the laser may be selected to optimize dissipation of heat in the device during processing to prevent unwanted spreading of heat, which may cause delamination or melt spots in the lower conductive layer. Such a pulse width is generally about 100 picoseconds or shorter, but may vary depending on the materials being scribed. Generally, pulse widths lasting 1 nm or longer have been found to cause unwanted spreading of heat, but use of a laser having a shorter pulse width may be beneficial. In some examples, the pulse width of the laser may be about 50 picoseconds or shorter. In further examples, the pulse width may be about 10 picoseconds or shorter. In yet further examples, the pulse width may be about 6 picoseconds.

The wavelength of the laser may range from about 340 nm to about 1070 nm. More particularly, the wavelength of the laser may be selected to minimize absorption of the beam energy by the substrate, and more particularly to optimize the ratio of absorption between the lower conductive layer and the substrate. The optimal wavelength may vary depending on the substrate material and other layer materials. In some embodiments, the lower conductive layer should absorb a high percentage of the energy from the laser, and the substrate should absorb a low percentage of the energy. For example, in the electrochromic devices described in copending U.S. application Ser. No. 13/950,791, it has been found that the glass substrates for electrochromic devices have a relatively low absorption of green light, and indium tin oxide on a glass substrate exhibits a higher ratio of absorption. Further, it has been found that light having a wavelength between about 515 nm and about 532 nm is preferred in such a device. In other devices using different materials, a laser emitting light having a different wavelength may be preferred.

Figure 8:
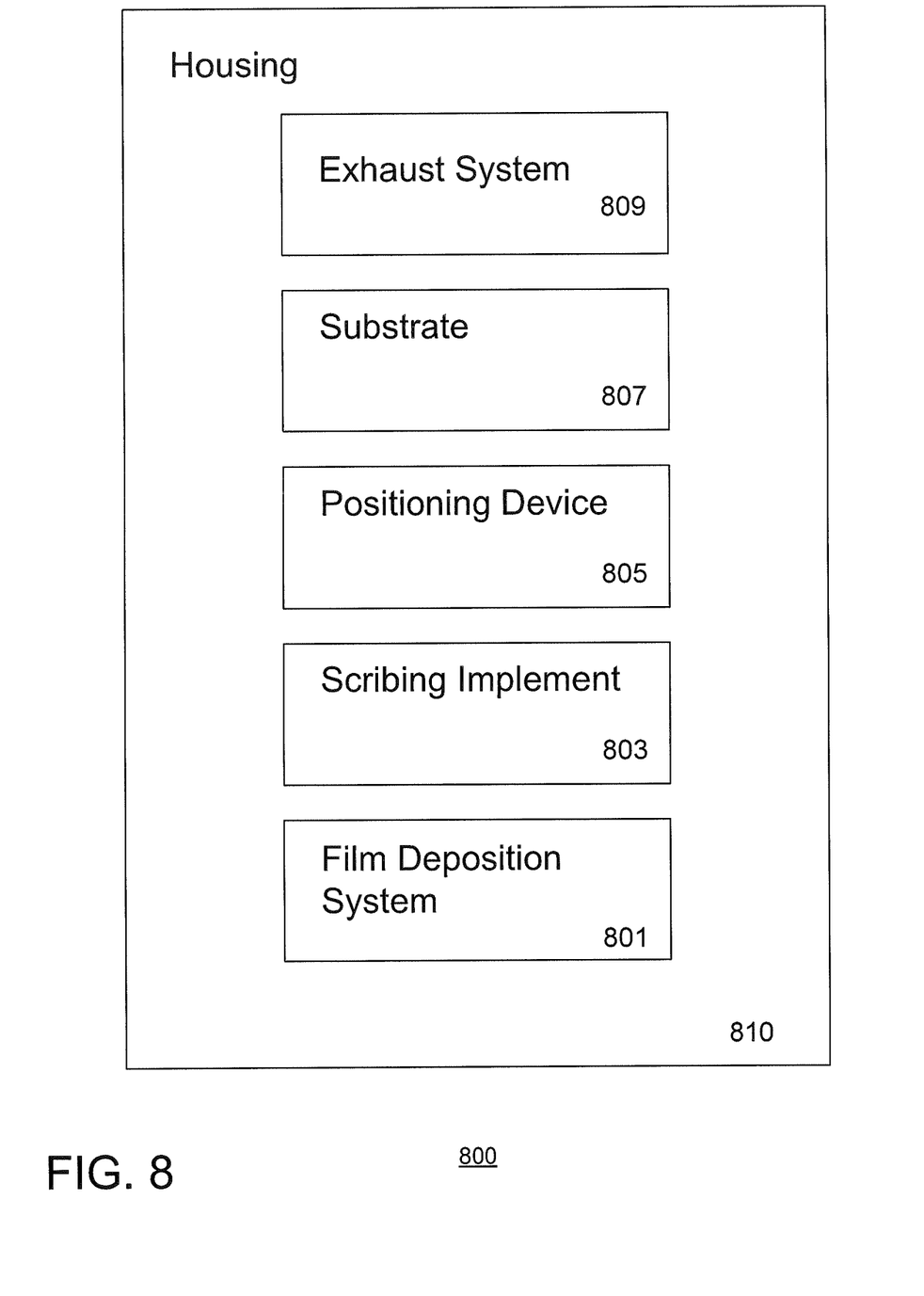
FIG. 8 is a block diagram of a system for forming an electrochromic device in accordance with an embodiment of the current invention.

FIG. 8 provides a simplified diagram of a system 800 for forming the electroactive device of the present disclosure. The system 800 includes a housing or chamber 810 for fabrication of the device. The chamber 810 may be any standard evaporation chamber or coater known in the art used for fabrication of electroactive devices. For example, the chamber 810 may be a coater, such as for performing an initial stage of coating the conductive and/or electroactive layers on a substrate. The chamber 810 may be operated at either vacuum or under other pressure conditions (e.g., normal atmospheric pressure). Housed within the chamber 810 may be the film deposition system 801, the laser 803, a positioning device 805 for positioning or adjusting the position of beam of the laser relative to the substrate, the substrate 807, and a collection system 809.

The film deposition system 801 may be a magnetron sputter, DC sputter, or RF sputter, or other means for depositing thin films of conductive and/or insulating materials on a substrate in vacuum conditions. The laser 803, as described above, may in some examples have a pulse width less than about 100 picoseconds. In some embodiments, the positioning device 805 may hold the laser in place and/or mount the laser within the chamber, with the laser oriented such that it emits a laser beam at the surface of the substrate 807. In some examples, the positioning device 75 may be configured such that the laser beam is incident to the film side of the substrate 807. The positioning device 805 may further be configured to displace or reorient the laser such that the focused beam may move along the scribe edge on the surface of the substrate 807.

The collection system 809 may be a vent, electrostatic plate, chilled surface, pipe, or other structure for collecting particulate materials or vapors generated by focusing of the beam on the surface of the substrate. The collection system 809 may further be configured to filter those particulate materials or vapors, and/or carry them out of the housing 810. Collection and/or ejection of the particulate materials or vapors is beneficial for preventing materials from being 'blown' around during purging, venting, and/or pumpdown of the housing, which in turn could scratch or otherwise damage the substrate and/or film structure.

In one example of the present disclosure, the electroactive device may be formed without having to remove the substrate from the housing. For instance, in forming the electrochromic device of FIG. 3, the substrate may be placed in the housing, a layer of conductive material may be formed on the surface of the substrate, a portion of the layer of conductive material may be removed using the laser, and at least one of the electrochromic electrode layer and the counter electrode layer may be formed on the layer of conductive material, all without removing the substrate from the housing. In some examples, these steps may be performed in a single continuous vacuum step.

Although each of the above embodiments illustrates a cut at location P1 through only the lower conductive layer, it will be understood that the benefits of using a short pulse-width laser and/or laser positioned incident to the film side of the substrate may be realized in scribes through multiple layers of a device, such as through both the lower conductive layer and the adjacent electrode layer, or further such as through the lower conductive layer, the adjacent electrode layer, and further through the ion conductor layer(s) adjacent to the electrode layer. Such scribes are described in, for example, copending U.S. application Ser. No. 13/786,934, the disclosure of which is hereby incorporated in its entirety herein.

Figure 9A:
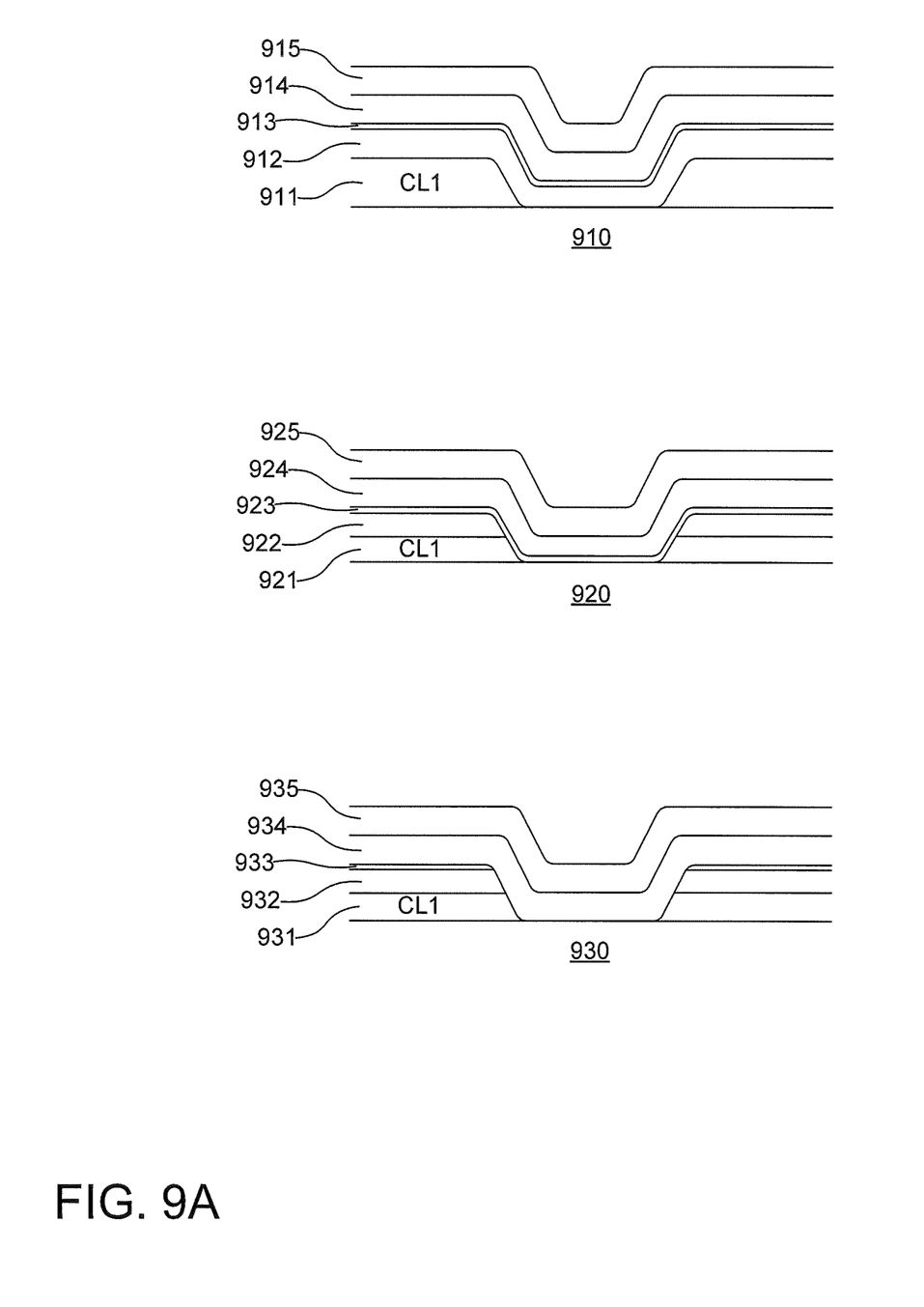
FIGS. 9A-9C are schematic cross-sections of electroactive devices, each in accordance with an embodiment of the current invention.
Figure 9B:
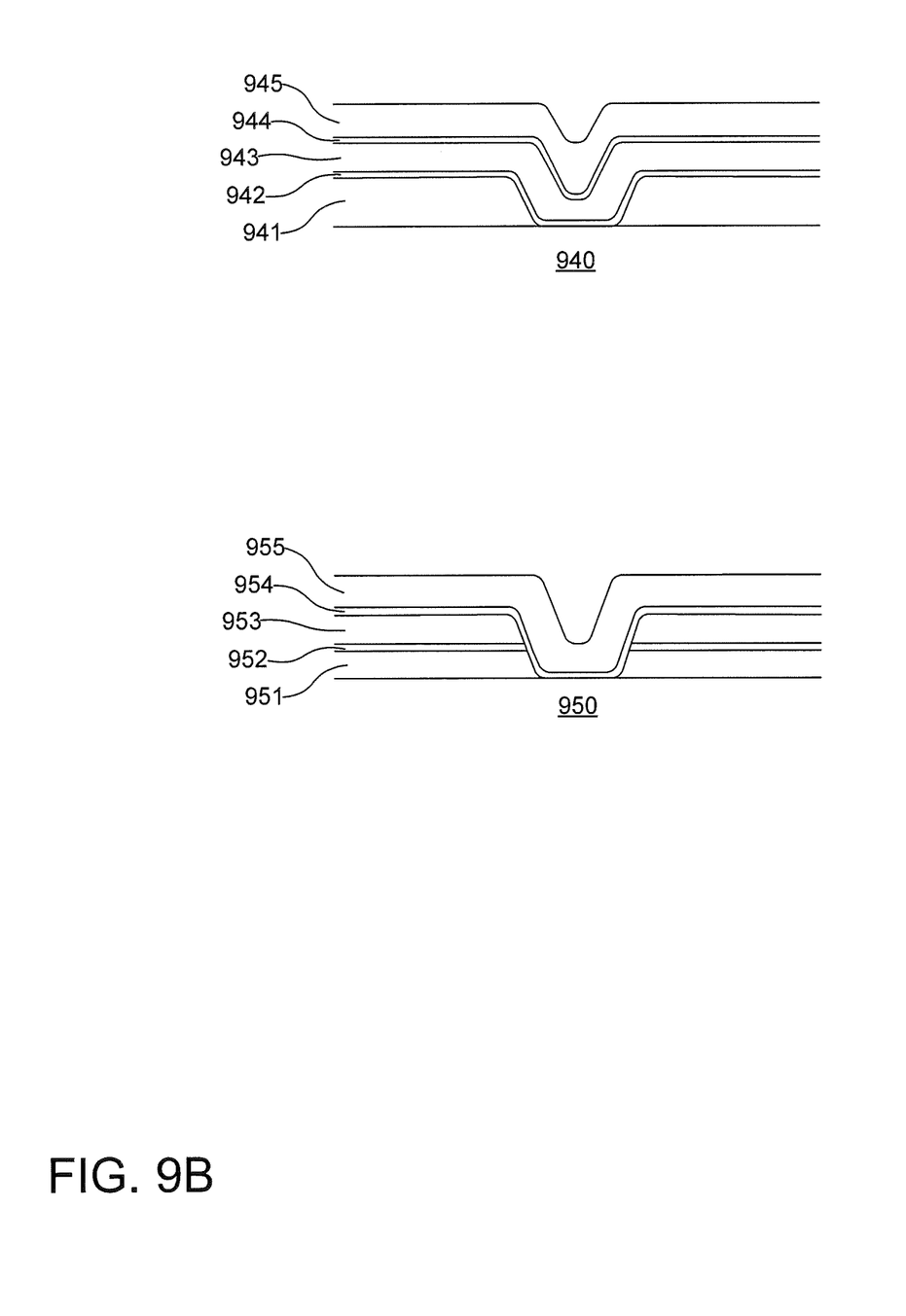
Figure 9C:
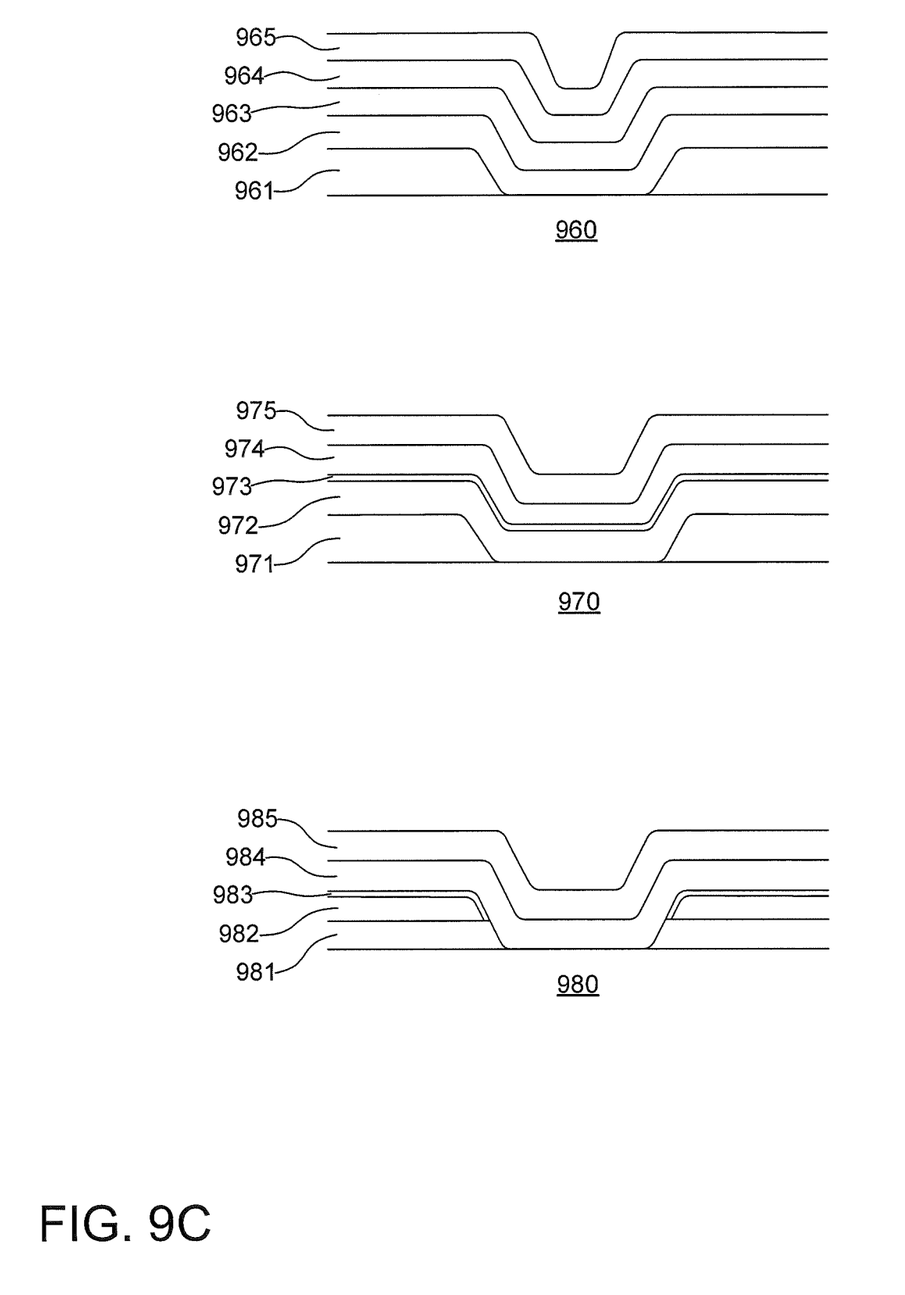

As described above, in the case of a scribed electrochromic device, the above described benefits may be realized in scribes through the conductive layer 911 only, such that the electrode layers and ion conductor layer 912-914 separate the upper and lower conductive layers, 915 and 911 respectively (910), or through the conductive layer 921 and one electrode layer 922, such that the emitting layer 923 and the other transport layer 924 separate the upper and lower conductive layers, 925 and 921 respectively (920), or even through the conductive layer 931, one electrode layer 932, and the ion conductor layer 933, such that only the other electrode layer 934 separates the upper and lower conductive layers, 935 and 931 respectively (930). Similarly, in the case of a scribed electroluminescent device, the above described benefits may be realized in scribes through the conductive layer 941 only, such that the insulating layers and phosphor layer 942-944 separate the upper and lower conductive layers, 945 and 941 respectively (940), or through the conductive layer 951, one insulating layer 952, and the phosphor layer 953 (e.g., such that only the other insulating layer 954 separates the upper and lower conductive layers, 955 and 951 respectively) (950). In the case of a scribed OLED, the above described benefits may be realized in scribes through the conductive layer 961 only, such that the transporting layers and emitting layer 962-964 separate the upper and lower conductive layers, 965 and 961 respectively (960), or through the conductive layer and one transport layer, such that the emitting layer and the other transport layer separate the upper and lower conductive layers (not shown), or even through the conductive layer, one transport layer, and the emitting layer, such that only the other transport layer separates the upper and lower conductive layers (also not shown). Further, in the case of a scribed photovoltaic device, the above described benefits may be realized in scribes through the conductive layer 971 only, such that the acceptor/donor layers and pn-junction layer 972-974 separate the upper and lower conductive layers, 975 and 971 respectively (970), or through the conductive layer 981, one of the acceptor/donor layers 982, and the p-n junction layer 983, such that only the other acceptor/donor layer 984 separates the upper and lower conductive layers, 985 and 981 respectively) (980). Each of these embodiments is depicted for illustrative clarity in the diagrams of FIGS. 9A-C.

Also, in each of the above described embodiments in which scribing is performed incident to the film side of the substrate, such scribing is described as performed with a laser. However, it will be understood that the benefits of at least the tapered sidewall edges may be achieved using other cutting or ablation tools/techniques, such as etching, mechanical abrading, or any other suitable removing processes known in the art ("cutting"). Furthermore, while the above embodiments are described in connection with a chamber housing a laser, it will be understood that the chamber may be equipped with any of these other cutting or ablation tools in order to achieve the tapered sidewall of the present disclosure.

Additionally, although each of the above embodiments illustrates device structure between only two busbars, it will be understood that the above disclosure similarly applies to devices having more than two busbars as well. In such devices, each of the busbars may be electrically separated from each other by forming the structures as described above. Forming of each of the structures may be performed simultaneously or sequentially, and the layers formed between each pair of busbars may be scribed in any of the manners described above.

Lastly, the embodiments described above and illustrated in the figures are not limited to rectangular shaped devices. Rather, the descriptions and figures are meant only to depict cross-sectional views of an device and are not meant to limit the shape of such a device in any manner. For example, the device may be formed in shapes other than rectangles (e.g., triangles, circles, arcuate structures, etc.). For further example, the device may be shaped three-dimensionally (e.g., convex, concave, etc.).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. An electroactive device formed by a process comprising the steps of:
    forming one or more electroactive layers on a substrate, wherein the electroactive layers comprise a first conductive layer and a first electrode layer;
    removing a portion of the one or more electroactive layers using a laser to define a gap in the one or more electroactive layers, wherein the gap is formed in a single step, wherein at least one of the one or more electroactive layers has a tapered sidewall; and
    forming a second conductive layer and second electrode layer over the one or more electroactive layers and the gap, wherein the second conductive layer comprises a tapered sidewall formed by the laser and wherein the second electrode layer directly contacts either the first electrode layer or the first conductive layer, wherein the one or more electroactive layers is at least twice as thick as the second electrode layer, and wherein a width at a top of the gap is larger than a width at a bottom of the gap.

2. The electroactive device of claim 1, wherein the laser has a pulse width of about 100 picoseconds or shorter.

3. The electroactive device of claim 2, wherein the pulse width of the laser is about 10 picoseconds or shorter.

4. The electroactive device of claim 1, wherein the gap has tapered sidewalls formed by the laser.

5. The electroactive device of claim 4, wherein the gap does not have melt spots along the tapered sidewalls.

6. The electroactive device of claim 1, wherein each tapered sidewall comprises a rounded upper edge.

7. The electroactive device of claim 1, wherein a portion of the first conductive layer is removed to define at least a portion of the gap in the one or more electroactive layers.

8. The electroactive device of claim 7, wherein the first conductive layer comprises the gap, and wherein the gap directly touches the substrate without delamination along a sidewall of the gap.

9. The electroactive device of claim 1, further comprising disposing a first bus bar and a second bus bar immediately over one of the first conductive layer and the second conductive layer.

10. The electroactive device of claim 1, wherein tapered sidewall of the at least one of the one or more electroactive layers has an angle that is a mirror of an angle of the tapered sidewall of the second conductive layer.

11. An electroactive device formed by a process comprising the steps of:
    forming one or more electroactive layers on a substrate, wherein the electroactive layers comprise a first conductive layer and a first electrode layer;
    removing a portion of the one or more electroactive layers using a laser to define a gap in the one or more electroactive layers, wherein a width at a top of the gap is larger than a width at a bottom of the gap and wherein the gap is formed in a single step, wherein at least one of the one or more electroactive layers has a tapered sidewall; and
    forming one or more additional layers over the one or more electroactive layers and the gap, wherein the one or more additional layers comprises an ion conducting layer, a second electrode layer, and a second conductive layer, wherein the second conductive layer comprises a tapered sidewall indirectly formed by the laser, wherein the second electrode layer directly contacts either the first electrode layer or the first conductive layer, and wherein the one or more electroactive layers is at least twice as thick as the second electrode layer.

12. The electroactive device of claim 11, wherein the second electrode layer contacts both the first conductive layer and the first electrode layer.

13. The electroactive device of claim 11, wherein the second electrode layer contacts the substrate.

14. The electroactive device of claim 11, wherein the second electrode layer comprises an electrochromic material.

15. The electroactive device of claim 11, wherein the gap has tapered sidewalls.

16. The electroactive device of claim 11, wherein a portion of the first conductive layer is removed to define the gap.

17. An electroactive device comprising:
    a first conductive layer and a second conductive layer, wherein one of said first and second conductive layers comprises a first portion and a second portion, wherein said first portion is spaced apart from said second portion by a gap having tapered sidewalls, wherein a width at a top of the gap is larger than a width at a bottom of the gap and wherein the tapered sidewall is uniform; wherein the gap is formed in a single step and
    one or more electroactive layers disposed between said first and second conductive layers, wherein the one or more electroactive layers extend over said gap; wherein the one or more electroactive layers comprises a first electrode comprising one of an electrochromic electrode layer and a counter electrode layer, a second electrode comprising the other of said electrochromic electrode layer and said counter electrode layer, and an ion-conductor layer for conducting ions between said first and second electrodes; and wherein the other of said first and second conductive layers comprises a tapered sidewall indirectly formed by the laser.

18. The electroactive device of claim 17, wherein the second conductive layer comprises a tapered sidewall.

19. The electroactive device of claim 18, wherein the second electrode layer directly contacts either the first electrode layer or the first conductive layer.

20. The electroactive device of claim 19, wherein the first conductive layer is twice as thick as the second electrode layer.

* * * * *